(12) United States Patent
Andre

(10) Patent No.: US 7,474,241 B2
(45) Date of Patent: Jan. 6, 2009

(54) DELTA-SIGMA MODULATOR PROVIDED WITH A CHARGE SHARING INTEGRATOR

(75) Inventor: Eric Andre, Hurtieres (FR)

(73) Assignee: STMicroelectronics, SA, Montrouge (FR)

( * ) Notice: Subject to any disclaimer, the term of this patent is extended or adjusted under 35 U.S.C. 154(b) by 0 days.

(21) Appl. No.: 11/733,375

(22) Filed: Apr. 10, 2007

(65) Prior Publication Data
US 2007/0236375 A1 Oct. 11, 2007

(30) Foreign Application Priority Data
Apr. 11, 2006 (FR) ................................ 06 51323

(51) Int. Cl.
*H03M 3/00* (2006.01)
(52) U.S. Cl. .................. 341/143; 341/118; 341/120; 341/144; 341/155; 341/172
(58) Field of Classification Search .............. 341/143, 341/118–122, 172
See application file for complete search history.

(56) References Cited

U.S. PATENT DOCUMENTS

| | | | | |
|---|---|---|---|---|
| 4,939,516 A * | 7/1990 | Early | ......................... | 341/143 |
| 5,659,314 A * | 8/1997 | Tokura et al. | ................ | 341/143 |
| 6,184,812 B1 * | 2/2001 | Younis et al. | ................ | 341/143 |
| 6,693,572 B1 * | 2/2004 | Oliaei et al. | ................. | 341/143 |
| 6,924,760 B1 * | 8/2005 | McLeod et al. | ............ | 341/144 |
| 6,952,176 B2 * | 10/2005 | Frith et al. | ................... | 341/143 |
| 7,138,932 B1 * | 11/2006 | Chen | .......................... | 341/108 |
| 7,230,555 B2 * | 6/2007 | Dolazza et al. | ............ | 341/143 |
| 7,304,483 B2 * | 12/2007 | O'Dowd et al. | ............ | 324/658 |
| 7,319,419 B1 * | 1/2008 | Lash et al. | ................... | 341/118 |
| 7,375,666 B2 * | 5/2008 | Melanson | .................. | 341/143 |
| 7,379,012 B2 * | 5/2008 | Sutardja | ..................... | 341/172 |
| 2004/0113824 A1 | 6/2004 | Zierhofer | .................... | 341/143 |
| 2006/0187097 A1 * | 8/2006 | Dolazza et al. | ............ | 341/143 |

FOREIGN PATENT DOCUMENTS

EP 1130784 9/2001

OTHER PUBLICATIONS

Van Veldhoven R., "A Tri-Mode Continuous-Time ΣΔ Modulator with Switched-Capacitor Feedback DAC for a GSM-EDGE/CDMA2000/UMTS Receiver", Solid-State Circuits Conference, 2003, Digest of Technical Papers, *IEEE International*, Feb. 9-13, 2003. pp. 1-10.

Redman-White W., et al., "Integrated Fourth-order ΣΔ converter with stable self-tuning continuous-time noise shaper", IEE Proceedings: Circuits Devices and Systems, Institution of Electrical Engineers, Stenvenage, GB, Jun. 1, 1994. pp. 145-150.

* cited by examiner

*Primary Examiner*—Linh V Nguyen
(74) *Attorney, Agent, or Firm*—Lisa K. Jorgenson; Allen, Dyer, Doppelt, Milbrath & Gilchrist, P.A.

(57) ABSTRACT

An analog-digital delta-sigma converter includes a plurality of continuous time integrators for performing a delta-sigma modulation. Each integrator includes at least one charge sharing integrator at a modulator input. One or more pure integrators follow the charge sharing integrator.

21 Claims, 5 Drawing Sheets

DELTA-SIGMA MODULATOR PROVIDED WITH A CHARGE SHARING INTEGRATOR

CROSS REFERENCE TO RELATED APPLICATION

This application claims the priority benefit of French patent application number 0651323 filed on Apr. 11, 2006, titled "Delta-Sigma Modulator Provided With A Charge Sharing Integrator", which is hereby incorporated by reference in its entirety.

FIELD OF THE INVENTION

The invention relates to electronic devices that can perform a delta-sigma modulation, such as analog-digital delta-sigma converters. More particularly, a delta-sigma modulator device includes continuous time integrators, with each continuous time integrator including at least one charge sharing integrator at the modulator input, and at least one pure integrator following the charge sharing integrator. Improvements in terms of consumption, immunity to noise and linearity of the modulator are provided with the delta-sigma modulator device.

BACKGROUND OF THE INVENTION

Delta-sigma conversion is an analog-digital conversion technique based on over sampling and formatting of quantification noise. An example of a delta-sigma analog-digital converter according to prior art is illustrated on FIG. 1. This converter is formed from a delta-sigma modulator 10 followed by a digital processing stage 30. The digital processing stage 30 may include a digital filter 32 and an under sampling stage 34.

The delta-sigma modulator 10 can reject noise due to quantification of the converter input signal to frequencies located outside the required pass band. In this example, the order of the delta-sigma modulator 10 is 1 and includes a stage provided with a summation node 11, an integrator 12, and a quantifier 16 at the output from the integrator 12. The quantifier 16 is controlled by a sampling clock signal with frequency fs, and may be in the form of a blocking sampler followed by an analog-digital converter comprising one or several comparators.

The quantifier 16 may possibly be a low resolution quantifier formed from a single comparator. The modulator also includes at least one return or feedback digital-analog converter that can switch between two reference voltages, for example between a reference voltage −Vref and another reference voltage +Vref.

Depending on the order of the delta-sigma modulator, the modulator may be provided with several adjacent stages and may include a plurality of integrators. The integrators used in a delta-sigma modulator are usually pure integrators. A pure integrator means an element for which the output is proportional to the integral of the input signal, and for which the Laplace transform transfer function is equal to 1/s.

In a case in which the modulator is order N (where N is an integer≧2) and includes a plurality of pure integrators, implementation of the first integrator, in other words the integrator closest to the modulator input, is the most critical in that this first integrator needs to support the most severe constraints in terms of noise and linearity among the plurality of pure integrators. Constraints for manufacturing the first integrator are greater when the required pass bands are wider and require high operating speeds. Integrators in a delta-sigma modulator may be of a discrete time type, and for example, may be made using switched capacitors, or in one variation, continuous time type integrators may be used. Delta-sigma modulators fitted with continuous time integrators are usually capable of operating at higher speeds than discrete time modulators.

A pure continuous time integrator is usually made using one of the two methods described below that are illustrated with reference to FIGS. 2 and 3, respectively.

FIG. 2 shows an illustration of a first embodiment of the pure integrator 12 of the modulator described above with reference to FIG. 1. This integrator is said to be a transconductance integrator and comprises means 21 capable of forming a transconductance with value Gm and designed to convert an integrator input voltage V1 into a current I=Gm*V1. The current I is integrated through a capacitor 23 at the output from the transconductance. A signal V2 proportional to the integral of the input signal V1 is produced at the output of the integrator. Such a structure has the advantage that it operates in an open loop and is therefore fast.

A return signal Idac delivered by the digital-analog converter 14 to the integrator 12 does not pass through any active element, and it is integrated into the terminals of the capacitor 23. However, the performances of the integrator is related to the performance of the transconductance 21. This transconductance is difficult to implement and creates problems particularly with sensitivity to noise and a lack of linearity, when the delta-sigma modulator is made with a low power supply voltage, for example, on the order of 1.2 volts.

A second embodiment of the integrator 12 is illustrated on FIG. 3. In this second embodiment, the integrator is said to be an operational amplifier integrator and includes a resistance 25 with value R located at the input to the operational amplifier 27. The resistance can convert an input voltage V1 to the integrator into a current integrated at the terminals of a capacitor 26 with capacitance C, connected between the input and output terminals of the operational amplifier 27. Such an integrator structure operates in a closed loop and has the advantage of being very linear. On the other hand, its operating speed is limited by performances of the operational amplifier 27, and particularly by the product of the gain and the band of this amplifier 27. With such an integrator, the digital-analog converter 14 outputs a return signal Idac to a capacitor terminal 26 and at the input of the operational amplifier 27.

An architecture of an order N delta-sigma modulator (where N is a positive integer) according to the prior art, represented as an equivalent Laplace transform model, is illustrated on FIG. 4. Such a delta-sigma modulator comprises n pure transconductance type integrators $20_1, \ldots, 20_n$ (as described previously with reference to FIG. 2) or operational amplifier type integrators (as described previously with reference to FIG. 3), and with an equivalent transfer function of 1/s. The order N delta-sigma modulator is also provided with 1 to n feedback or return digital-analog converters $14_1, \ldots, 14_n$, with gains of $b_1, b_2, b_3, \ldots b_n$ respectively. The delta-sigma modulator is also provided with a quantifier (represented by a block reference 34 on FIG. 4)

SUMMARY OF THE INVENTION

In view of the foregoing background, an object of the invention is to provide a delta-sigma modulator structure with improved linearity and operating speed.

This and other objects, advantages and features in accordance with the invention are provided by a delta-sigma modulator device comprising at least one charge sharing integrator.

Such a charge sharing integrator can combine the advantages of a transconductance integrator and a classical operational amplifier integrator.

A delta-sigma modulator device comprises at least one given stage provided with at least one charge sharing integrator. The charge sharing integrator may comprise an operational amplifier and an integration capacitor. One terminal of the integration capacitor may be connected to an input of the operational amplifier, and another terminal of the integration capacitor may be connected to an output from the operational amplifier. The modulator may also comprise at least one return digital-analog converter, and means for applying an output signal from the digital-analog converter to the terminals of the integration capacitor during a first phase, and to disconnect or isolate the output from the digital-analog converter of the integration capacitor during a second phase.

An output signal from the feedback digital-analog converter can be applied to the integration capacitor of the charge sharing integrator without passing through the operational amplifier of this charge sharing integrator.

The delta-sigma modulator may also include one or several other stages, each provided with at least one pure integrator. Advantageously, the given stage may be the modulator input stage.

According to one possibility, the delta-sigma modulator device may also include at least one quantifier controlled by a sampling clock signal. The means of applying an output signal from the digital-analog converter to the terminals of the integration capacitor during a first phase, and to disconnect or isolate the output from the digital-analog converter of the integration capacitor during a second phase, may include switch means or a switch controlled by the sampling clock signal.

According to one embodiment of the delta-sigma modulator device in which the output signal from the first digital-analog converter is output from means forming a capacitor belonging to the digital-analog converter, the modulator may include means controlled by the sampling clock signal so that during the first phase it can apply a signal Vdac to the capacitor of the digital-analog converter during the first phase. This signal Vdac is produced by the first digital-analog converter, and connects the capacitor of the digital-analog converter of the integration capacitor during the second phase.

The capacitor of the digital-analog converter can charge during the first phase, while the capacitor of the digital-analog converter discharges into the integration capacitor during the second phase.

The invention also relates to a digital-analog converter comprising at least one delta-sigma modulator as defined above.

BRIEF DESCRIPTION OF THE DRAWINGS

The invention will be better understood after reading the description of example embodiments given purely for information purposes, and is in no way to be limiting, with reference to the appended figures, wherein.

Identical, similar or equivalent parts of the different figures have the same numeric references so as to facilitate comparison between one figure and the other. The various parts shown in the figures are not necessarily all shown on the same scale, to make the figures more easily readable.

DETAILED DESCRIPTION OF THE PREFERRED EMBODIMENTS

Figure 3:
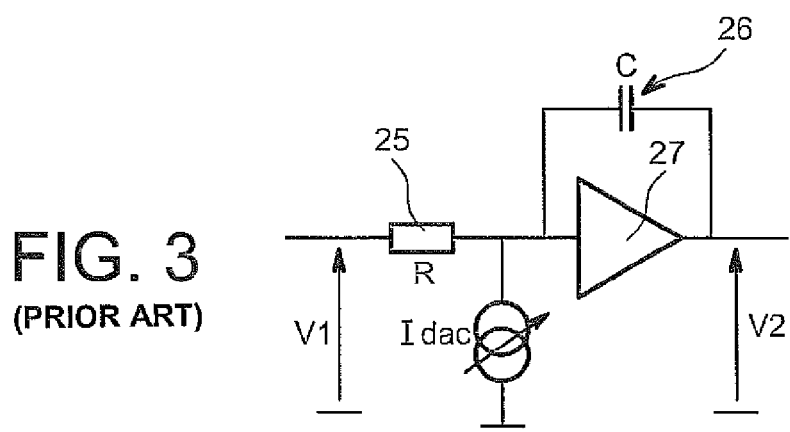
FIG. 3 illustrates a second example of a continuous time integrator used in a delta-sigma modulator according to the prior part.
Figure 4:
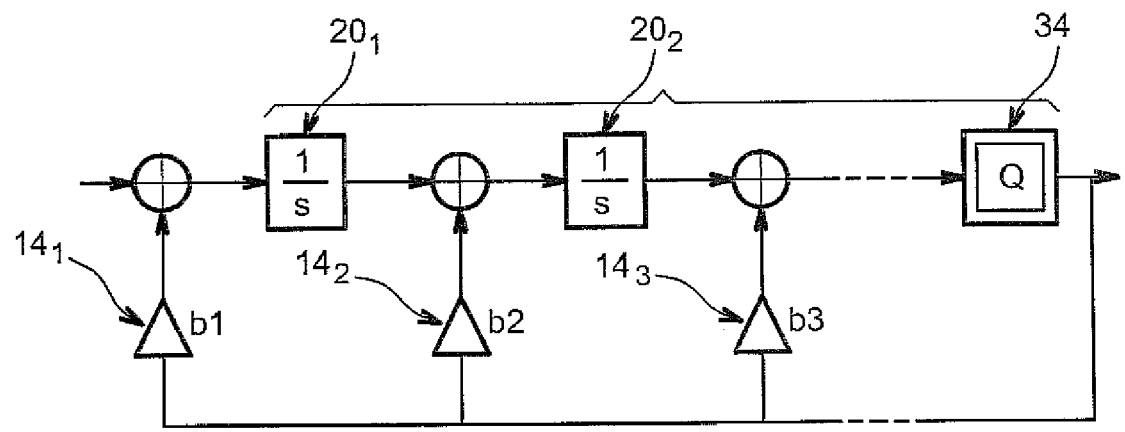
FIG. 4 illustrates an order N delta-sigma modulator architecture according to the prior part.
Figure 5:
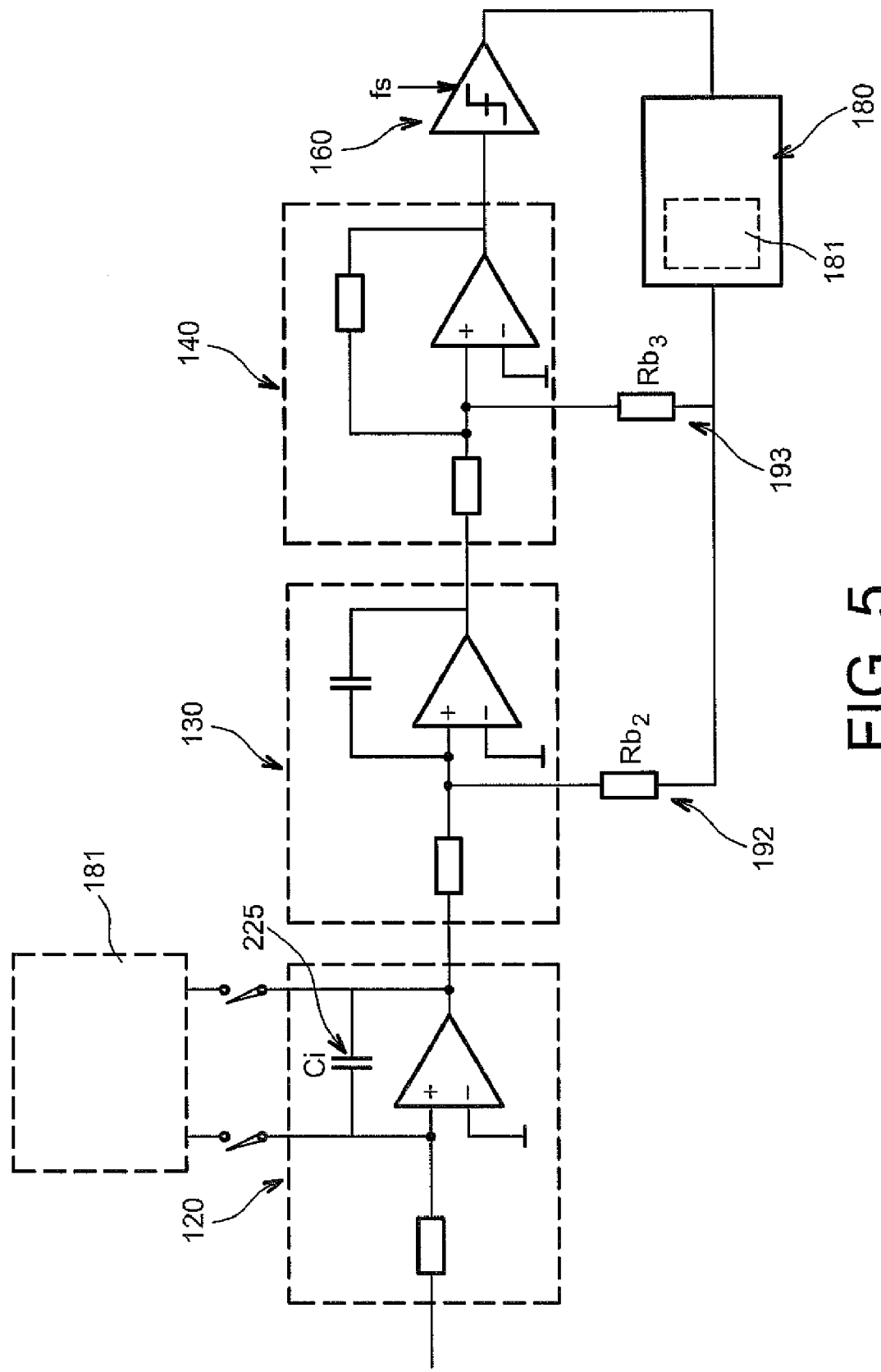
FIG. 5 illustrates a delta-sigma modulator according to the invention.

An example of a delta-sigma modulator according to the invention is illustrated in FIG. 5. This modulator comprises a first stage or an input stage provided with an integrator 120 called a charge sharing integrator. The delta-sigma modulator is also provided with at least one second stage at the output from the first stage comprising a pure integrator 130, for example of the operational amplifier type as described above with reference to FIG. 3. At the output from the second stage, the modulator may also comprise a third stage provided with an adder 140.

There is a quantifier 160 after the third stage, controlled by a sampling clock signal with frequency fs, for example in the form of a blocking sampler followed by an analog-digital converter provided with one or several comparators. The modulator also includes at least one return digital-analog converter 180, the output of which is connected through a resistance 192 with value Rb2 to a second stage summation node, and through another resistance 193 with value Rb3 to a third stage summation node.

The digital-analog converter can switch between a first reference voltage vref1 and a second reference voltage vref2 at the output. The first reference voltage vref1 may, for example, be on the order of 0.3 volts, while the second reference voltage Vref2 may, for example, be on the order of 0.9 volts. The modulator also includes means capable of outputting an output signal from the digital-analog converter 180 from an output stage 181 of the digital-analog converter 180, to the terminals of an integration capacitor 225 of the integrator 120. An output signal from the digital-analog converter 180 can be output to the terminals of the integration capacitor 225 as a function of variations in the sampling clock signal with frequency fs.

Figure 6:
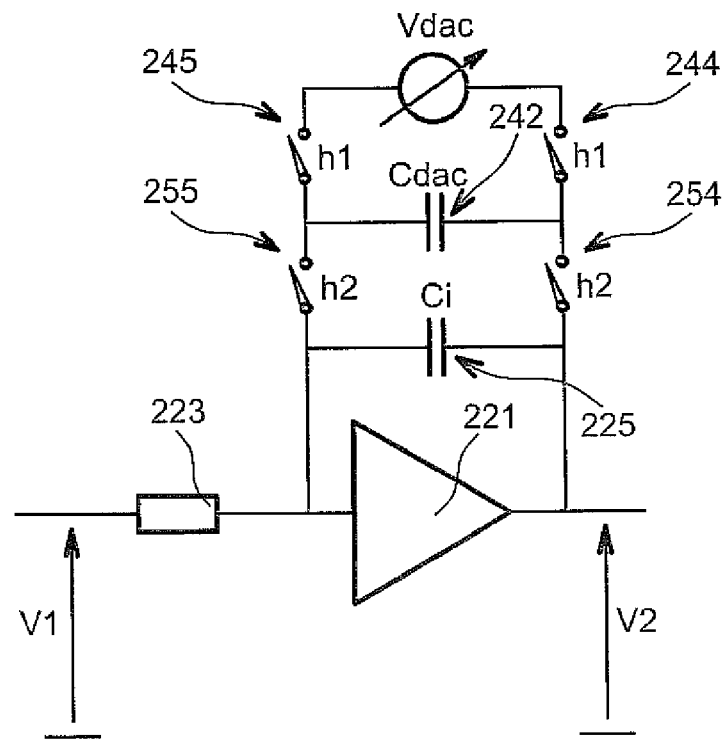
FIG. 6 illustrates a charge sharing integrator implemented in the first stage or the input stage of a delta-sigma modulator according to the invention.

The charge sharing integrator 120 will be described in more detail with reference to FIG. 6. This integrator 120 includes an operational amplifier 221, and a resistance 223 with value R at the input to the operational amplifier 221, and an integration capacitor 225 with capacitance Ci. One terminal of the integration capacitor 225 is connected to an input to the operational amplifier 221 and another terminal of which is connected to an output of the operational amplifier 221.

Figure 1:
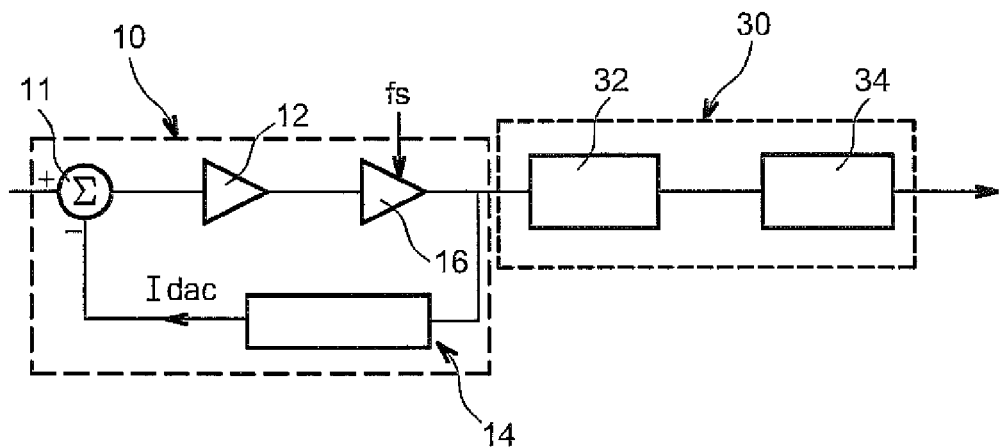
FIG. 1 illustrates an analog-digital converter provided with a delta-sigma modulator according to the prior part.
Figure 2:
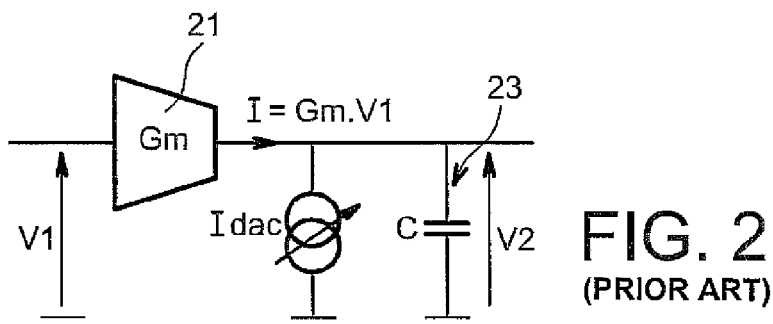
FIG. 2 illustrates a first example of a continuous time integrator used in a delta-sigma modulator according to the prior part.

The means capable of outputting the output signal from the digital-analog converter to the integration capacitor 225 may include the first switches 254, 255 controlled by the sampling clock signal with frequency fs. The charge sharing integrator 120 comprises an operational amplifier 221 so that improved linearity can be obtained as compared to a transconductance integrator. For the charge sharing integrator 120, as for a transconductance integrator like that described above with reference to FIG. 2, the return signal from the digital-analog converter 180 is not applied to the input of the operational amplifier 221, so that the operating speed of the modulator is better than a classical operational amplifier integrator (like that described with reference to FIG. 3).

During a period Ts=1/fs of the sampling clock signal, the integrator 120 can be in one of two operating phases.

During a first phase h1 during period Ts, for example between a time $t_1>0$ and a second time $t_2 \leq Ts/2$, a signal or a voltage $V_{DAC}$ produced by the digital-analog converter is applied through second switches 244, 245 to a capacitor 242 with capacitance $C_{DAC}$ of the digital-analog converter 180. During the first phase, the capacitor 242 with capacitance $C_{DAC}$ of the digital-analog converter 180 charges. The first switches 254, 255 are open during the first phase, such that the integration capacitor 225 and the output from the digital-analog converter 180 are not connected to each other. The first phase may be triggered by changing the state of the sampling clock signal. For example, by changing the sampling clock signal from a low state to a high state.

The second switches 244, 245, are open during a second phase h2, during the period Ts, for example between a time $t_3>Ts/2$ and a time $t4 \leq Ts$. During the second phase, the first switches 254, 255, are closed such that the integration capacitor 225 and the capacitor 242 of the digital-analog converter 180 are connected and the output signal from the digital-analog converter 180 is applied to the integrator 120. The second phase may be started following a change in the state of the sampling clock signal. For example, by the sampling clock signal changing from the high state to the low state.

During the second phase, charges are distributed between the capacitor 242 of the digital-analog converter 180 and the integration capacitor 225. The capacitance Cdac of the output capacitor 242 from the digital-analog converter 180 and the capacitance Ci of the integration capacitor 225 of the integrator are chosen such that charges stored by the capacitor 242 of the digital-analog converter 180 during the first phase can be transferred into the integration capacitor 225 during the second phase. The capacitances Cdac and Ci may be chosen such that Ci>>Cdac, for example, such that Ci is equal to at least 5 times Cdac or 10 times Cdac.

The voltage $V_i$ at the terminals of the integration capacitor 225 at a sampling instant n+1 in a given period, in comparison with a previous sampling time n for the period preceding the given period, may be such that:

$$Vi_{n+1}=V_{DACn}(C_{DAC}/(C_{DAC}+Ci))+Vi_n(C_i/(C_{DAC}+Ci))$$

The integrator 120 is also called a charge sharing integrator and is different from a pure integrator in that when the capacitor 242 of the digital-analog converter is connected to the integration capacitor 225, charges are drawn out of the integration capacitor 225.

Figure 7A:
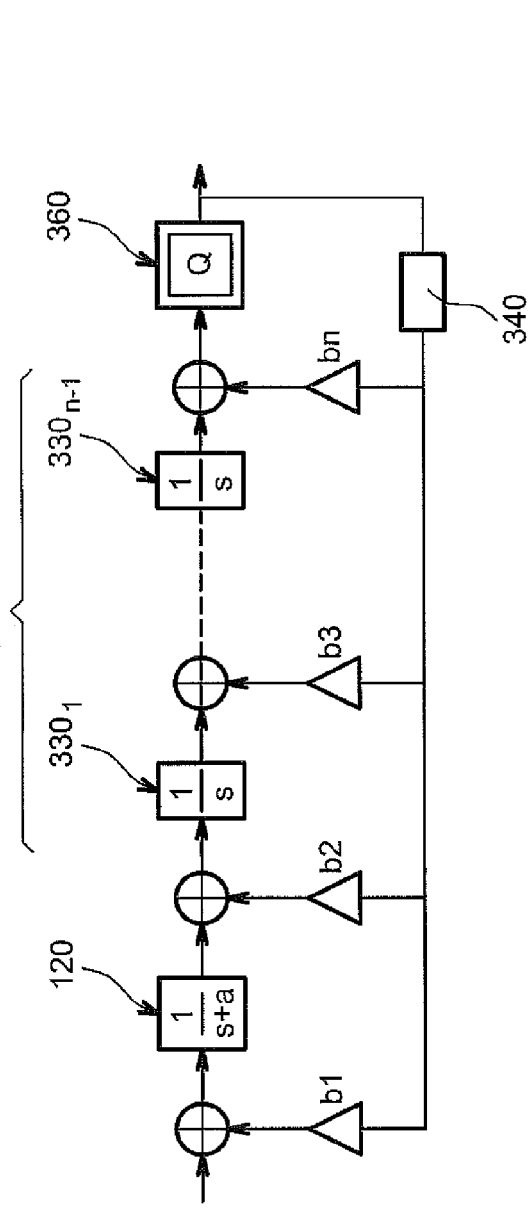
FIG. 7A illustrates an example architecture of an order N sigma-delta modulator according to the invention represented as an equivalent Laplace transform model.

An example architecture of an order N delta-sigma modulator according to the invention, represented as an equivalent Laplace transform model, is illustrated on FIG. 7A. This order N delta-sigma modulator is provided with an input stage comprising a charge sharing integrator 120 as described above, that may perform an equivalent Laplace transform transfer function equal to 1/(s+a), where a is a non-zero coefficient that depends particularly on the ratio between the capacitances Cdac and Ci. The charge sharing integrator is followed by N−1 (where N is a non-zero integer) pure integrators $330_1, \ldots, 330_{n-1}$ that may perform a Laplace trans-form transfer function equal to 1/s. The Delta-sigma modulator may also be provided with a quantifier (represented by a block 360 on FIG. 7A).

The Delta-sigma modulator may also comprise a return digital-analog converter 340 with gain coefficients $b_1, \ldots, b_n$ respectively. The coefficients a, $b_1, \ldots, b_n$, are selected so as to perform a formatting function of the order N quantification noise. At equal operating speeds, the consumption of a delta-sigma modulator according to the invention provided with a charge sharing integrator at the input and N other pure integrators following the charge sharing integrator is lower than an order N delta-sigma modulator according to the prior art.

Figure 7B:
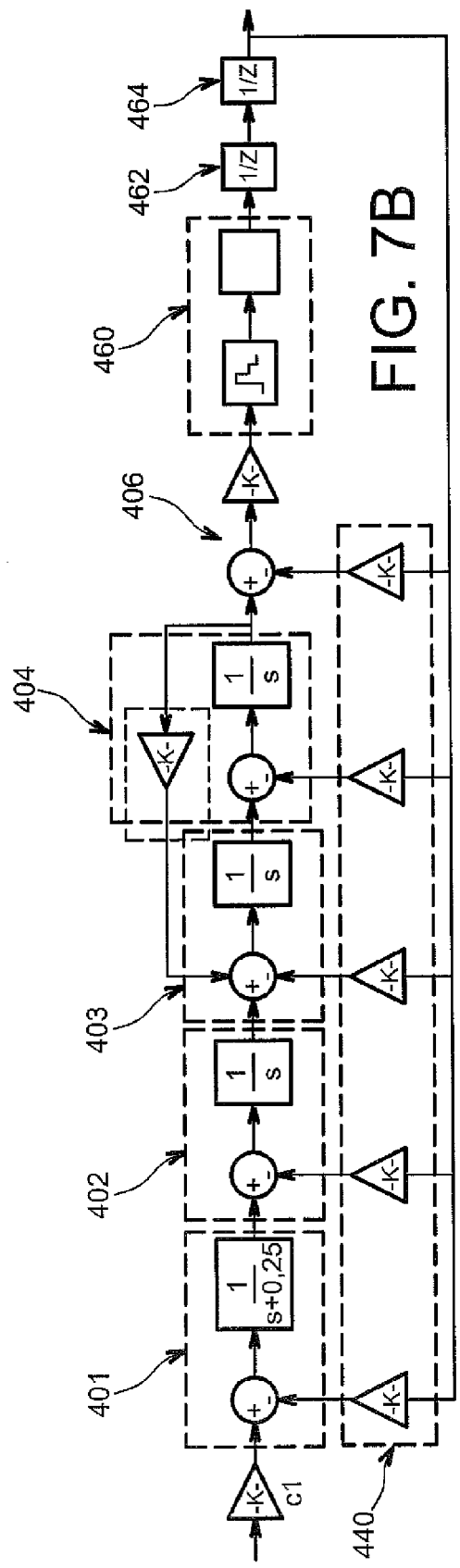
FIG. 7B shows another example architecture of an order 4 sigma delta modulator according to the invention represented as an equivalent Laplace transform model.

An example architecture of an order 4 delta-sigma modulator according to the invention represented as an equivalent Laplace transform model is illustrated on FIG. 7B. The delta-sigma modulator is provided with an input stage 401 comprising a charge sharing integrator like that described above, that may perform an equivalent Laplace transfer function equal to 1/(s+a), where a is a non-zero coefficient that depends particularly on the ratio between the capacitances Cdac and Ci and that may for example be equal to 0.25. The first stage is followed by three other stages 402, 403, 404 comprising a pure integrator of a Laplace transform transfer function equal to 1/s.

The delta-sigma modulator is also provided with an adder 406, means forming a quantifier (represented by a block 460 on FIG. 7B) at the output from the adder 406, several blocks forming a delay function, for example two blocks 462, 464 performing a delay function at the output from the quantifier 460. The delta-sigma modulator may include a return digital-analog converter (represented by a block 440 on FIG. 7B) that is fed back on each of the stages 401, 402, 403, 404 and to the input of the adder.

Figure 8:
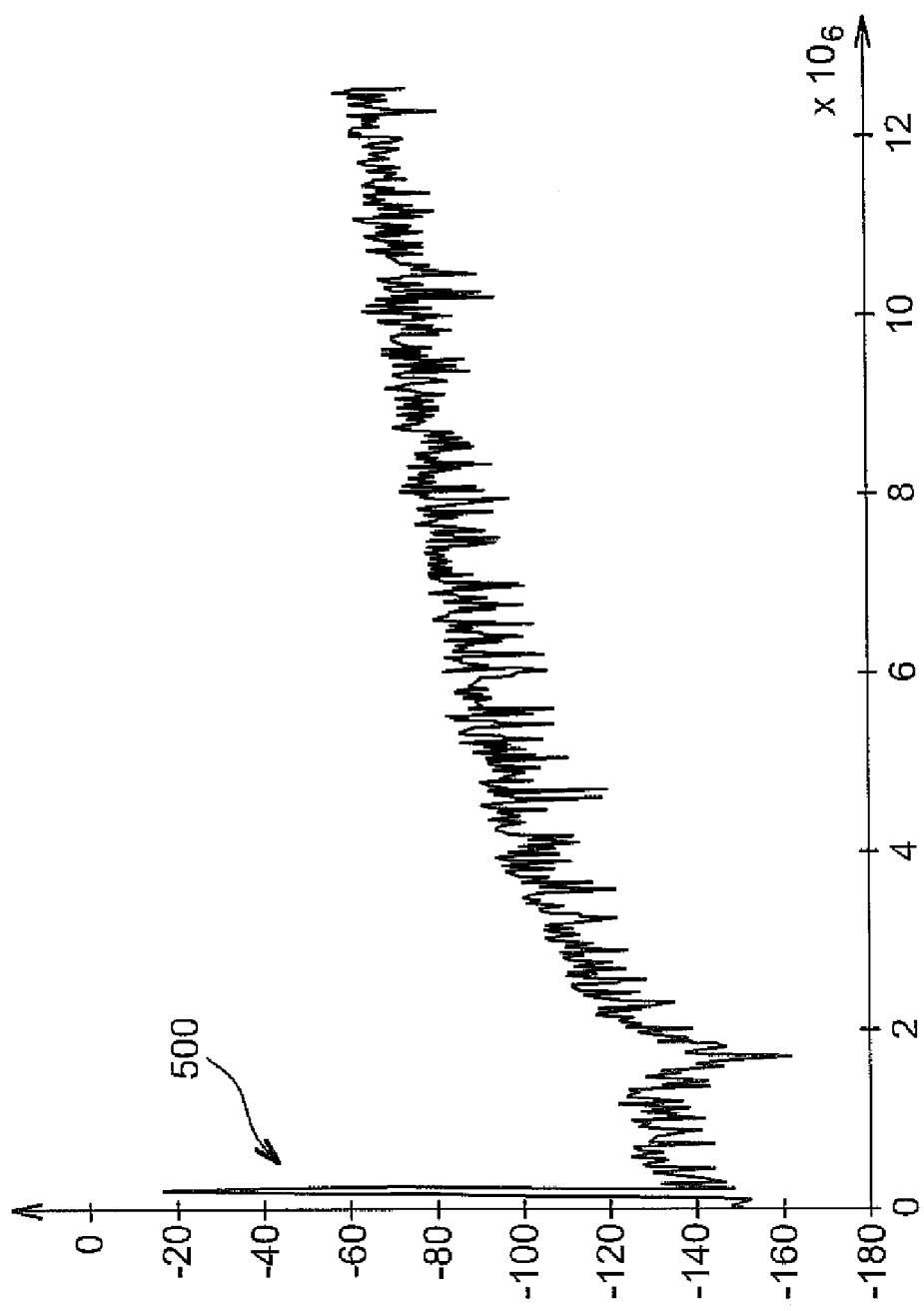
FIG. 8 illustrates the modulus of the output signal of an example order 4 sigma delta modulator implemented according to the invention.

FIG. 8 shows a frequency response curve of the order 4 delta-sigma modulator in FIG. 7B. In this figure, a peak 500 represents the response of the modulator following injection of a sinusoidal signal. With such a modulator, a signal-to-noise ratio SNR of the order of 95 dB can be obtained for an over sampling ratio of the order of 64. In other words, a pass band Bw on the order of 2 MHz at a sampling frequency fs of the order of 256 MHz is provided.

That which is claimed:

1. A delta-sigma modulator device comprising:
   a first stage comprising at least one charge sharing integrator comprising
   an amplifier, and
   an integration capacitor including a first terminal connected to an input of said amplifier, and a second terminal connected to an output from said amplifier;
   at least one return digital-analog converter; and
   a first phase switch coupled between the first terminal of said integration capacitor and said at least one return digital-analog converter, and a second phase switch coupled between the second terminal of the integration capacitor and said at least one return digital-analog converter, said first and second phase switches for applying an output signal from an output of said at least one return digital-analog converter to the first and second terminals of said integration capacitor during a first phase, and for isolating the output from said at least one return digital-analog converter during a second phase.

2. A delta-sigma modulator device according to claim 1, further comprising at least one additional stage connected to said first stage, said at least one additional stage comprising a transconductance integrator.

3. A delta-sigma modulator device according to claim 1, wherein said first stage is configured as an input stage of the delta-sigma modulator device.

4. A delta-sigma modulator device according to claim 1, further comprising at least one quantifier controlled by a sampling clock signal, and wherein said first and second phase switches are controlled by the sampling clock signal.

5. A delta-sigma modulator device according to claim 4, wherein said at least one return digital-analog converter comprises:
  a capacitor for providing the output signal; and
  at least one additional switch controlled by the sampling clock signal for applying a voltage to said capacitor during the first phase, with the voltage being produced by said at least one return digital-analog converter;
  wherein said first and second phase switches are for connecting said capacitor to said integration capacitor during the second phase.

6. A delta-sigma modulator device according to claim 5, wherein said capacitor of said at least one return digital-analog converter charges during the first phase, and discharges to said integration capacitor during the second phase.

7. A delta-sigma modulator device comprising:
  an input stage comprising at least one charge sharing integrator comprising
    an amplifier, and
    an integration capacitor including a first terminal connected to an input of said amplifier, and a second terminal connected to an output from said amplifier;
  at least one return digital-analog converter comprising
    a capacitor for providing an output signal, and
    at least one switch for applying a voltage to said capacitor during a first phase, with the voltage being produced by said at least one return digital-analog converter; and
  a first phase switch coupled between the first terminal of said integration capacitor and said at least one return digital-analog converter, and a second phase switch coupled between the second terminal of the integration capacitor and said at least one return digital-analog converter, said first and second phase switches for applying the output signal from said capacitor to the first and second terminals of said integration capacitor during the first phase, and for isolating the output from said at least one return digital-analog converter during the second phase.

8. A delta-sigma modulator device according to claim 7, further comprising at least one additional stage connected to said input stage, said at least one additional stage comprising a transconductance integrator.

9. A delta-sigma modulator device according to claim 7, further comprising at least one quantifier controlled by a sampling clock signal, and wherein said first and second phase switches are controlled by the sampling clock signal.

10. A delta-sigma modulator device according to claim 9, wherein said at least one switch is controlled by the sampling clock signal for applying the voltage to said capacitor during the first phase; and wherein said first and second phase switches are for connecting said capacitor to said integration capacitor during the second phase.

11. A delta-sigma modulator device according to claim 10, wherein said capacitor of said at least one return digital-analog converter charges during the first phase, and discharges to said integration capacitor during the second phase.

12. A digital-analog converter comprising:
  at least one delta-sigma modulator device comprising
    an input stage comprising at least one charge sharing integrator comprising
      an amplifier, and
      an integration capacitor including a first terminal connected to an input of said amplifier, and a second terminal connected to an output from said amplifier,
    at least one return digital-analog converter, and
    a first phase switch coupled between the first terminal of said integration capacitor and said at least one return digital-analog converter, and a second phase switch coupled between the second terminal of the integration capacitor and said at least one return digital-analog converter, said first and second phase switches for applying an output signal from an output of said at least one return digital-analog converter to the first and second terminals of said integration capacitor during a first phase, and for isolating the output from said at least one return digital-analog converter during a second phase; and
  a digital processing stage coupled to said at least one delta-sigma modulator device.

13. A digital-analog converter according to claim 12, wherein said at least one delta-sigma modulator device further comprises at least one additional stage connected to said input stage, said at least one additional stage comprising a transconductance integrator.

14. A digital-analog converter according to claim 12, wherein said at least one delta-sigma modulator device further comprises at least one quantifier controlled by a sampling clock signal, and wherein said first and second phase switches are controlled by the sampling clock signal.

15. A digital-analog converter according to claim 14, wherein said at least one return digital-analog converter comprises:
  a capacitor for providing the output signal therefrom; and
  at least one additional switch controlled by the sampling clock signal for applying a voltage to said capacitor during the first phase, with the voltage being produced by said at least one return digital-analog converter;
  wherein said first and second phase switches are for connecting said capacitor to said integration capacitor during the second phase.

16. A digital-analog converter according to claim 15, wherein said capacitor of said at least one return digital-analog converter charges during the first phase, and discharges to said integration capacitor during the second phase.

17. A method for operating a delta-sigma modulator device comprising an input stage comprising at least one charge sharing integrator comprising an amplifier, and an integration capacitor including a first terminal connected to an input of the amplifier, and a second terminal connected to an output from the amplifier; at least one return digital-analog converter; and a first phase switch coupled between the first terminal of the integration capacitor and the at least one return digital-analog converter, and a second phase switch coupled between the second terminal of the integration capacitor and the at least one return digital-analog converter, the method comprising:
  applying via the first and second phase switches an output signal from an output of the at least one return digital-analog converter to the first and second terminals of the integration capacitor during a first phase; and isolating via the first and second phase switches the output from the at least one return digital-analog converter during a second phase.

18. A method according to claim 17, wherein the delta-sigma modulator device further comprises at least one additional stage connected to the input stage, the at least one additional stage comprising a transconductance integrator.

19. A method according to claim 17, wherein the delta-sigma modulator device further comprises at least one quantifier controlled by a sampling clock signal, and wherein the first and second phase switches are controlled by the sampling clock signal.

20. A method according to claim 19, wherein the at least one return digital-analog converter comprises a capacitor for providing the output signal therefrom; and at least one additional switch controlled by the sampling clock signal for applying a voltage to the capacitor during the first phase, with the voltage being produced by the at least one return digital-analog converter; and wherein the first and second phase switches connect the capacitor to the integration capacitor during the second phase.

21. A method according to claim 20, wherein the capacitor of the at least one return digital-analog converter charges during the first phase, and discharges to the integration capacitor during the second phase.

* * * * *